(12) United States Patent
Minamisawa et al.

(10) Patent No.: US 10,121,909 B2
(45) Date of Patent: Nov. 6, 2018

(54) POWER SEMICONDUCTOR RECTIFIER WITH CONTROLLABLE ON-STATE VOLTAGE

(71) Applicant: ABB Technology AG, Zurich (CH)

(72) Inventors: Renato Minamisawa, Windisch (CH); Andrei Mihaila, Baden (CH); Vinoth Sundaramoorthy, Wettingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/066,561

(22) Filed: Mar. 10, 2016

(65) Prior Publication Data

US 2016/0268448 A1  Sep. 15, 2016

(30) Foreign Application Priority Data

Mar. 10, 2015 (EP) .................................. 15158369

(51) Int. Cl.
*H01L 29/872* (2006.01)
*H01L 29/16* (2006.01)
(Continued)

(52) U.S. Cl.
CPC ...... *H01L 29/872* (2013.01); *H01L 21/02529* (2013.01); *H01L 21/02532* (2013.01);
(Continued)

(58) Field of Classification Search
CPC ............. H01L 29/0611; H01L 29/0615; H01L 21/02529; H01L 21/02532; H01L 21/046;
(Continued)

(56) References Cited

U.S. PATENT DOCUMENTS

2002/0066926 A1* 6/2002 Hshieh ............... H01L 29/872
257/330
2009/0179297 A1 7/2009 Stewart et al.
(Continued)

OTHER PUBLICATIONS

European Search Report, EP 15158369.7, dated Aug. 19, 2015, 4 pages.

*Primary Examiner* — Stephen Bradley
*Assistant Examiner* — Patricia Reddington
(74) *Attorney, Agent, or Firm* — J. Bruce Schelkopf; Taft Stettinius & Hollister LLP (57) ABSTRACT

It is the object of the invention to provide a power semiconductor rectifier with a low on-state-voltage and high blocking capability. The object is attained by a power semiconductor rectifier comprising: a drift layer having a first conductivity type; and an electrode layer forming a Schottky contact with the drift layer, wherein the drift layer includes a base layer having a peak net doping concentration, below $1 \cdot 10^{16}$ cm$^{-3}$ and a barrier modulation layer which is in direct contact with the electrode layer to form at least a part of the Schottky contact, wherein a net doping concentration of the barrier modulation layer is in a range between $1 \cdot 10^{16}$ cm$^{-3}$ and $1 \cdot 10^{19}$ cm$^{-3}$ and wherein the barrier modulation layer has a layer thickness in a direction vertical to the interface between the electrode layer and the barrier modulation, layer of at least 1 nm and less than 0.2 µm.

20 Claims, 6 Drawing Sheets

(51) Int. Cl.
    *H01L 29/861*     (2006.01)
    *H01L 21/02*     (2006.01)
    *H01L 21/04*     (2006.01)
    *H01L 21/265*     (2006.01)
    *H01L 21/283*     (2006.01)
    *H01L 21/306*     (2006.01)
    *H01L 29/417*     (2006.01)
    *H01L 29/47*     (2006.01)
    *H01L 29/66*     (2006.01)
    *H01L 29/06*     (2006.01)

(52) U.S. Cl.
    CPC ........ H01L 21/046 (2013.01); H01L 21/0475 (2013.01); H01L 21/0485 (2013.01); H01L 21/0495 (2013.01); H01L 21/26513 (2013.01); H01L 21/283 (2013.01); H01L 21/30604 (2013.01); H01L 29/0684 (2013.01); H01L 29/16 (2013.01); H01L 29/1608 (2013.01); H01L 29/417 (2013.01); H01L 29/6606 (2013.01); H01L 29/66143 (2013.01); *H01L 29/0619* (2013.01); *H01L 29/0657* (2013.01); *H01L 29/47* (2013.01); *H01L 29/6609* (2013.01); *H01L 29/861* (2013.01)

(58) Field of Classification Search
    CPC ............. H01L 21/0475; H01L 21/0485; H01L 21/0495; H01L 21/26513; H01L 21/283; H01L 21/30604; H01L 29/0684; H01L 29/16; H01L 29/1608; H01L 29/417; H01L 29/6606; H01L 29/66143; H01L 29/872–29/8725
    USPC .......................................................... 257/77
    See application file for complete search history.

(56) References Cited

U.S. PATENT DOCUMENTS

| | | | |
|---|---|---|---|
| 2012/0256195 A1 | 10/2012 | Aketa | |
| 2013/0140584 A1* | 6/2013 | Kameshiro | H01L 29/861 257/77 |
| 2014/0035090 A1* | 2/2014 | Qu | H01L 29/36 257/475 |
| 2014/0167201 A1* | 6/2014 | Arai | H01L 29/0611 257/471 |
| 2016/0254393 A1* | 9/2016 | Ohse | H01L 29/47 257/77 |

* cited by examiner

POWER SEMICONDUCTOR RECTIFIER WITH CONTROLLABLE ON-STATE VOLTAGE

FIELD OF THE INVENTION

The present invention relates to a power semiconductor rectifier according to the preamble of claim 1 and to a method for manufacturing such power semiconductor rectifier.

BACKGROUND OF THE INVENTION

Figure 1:
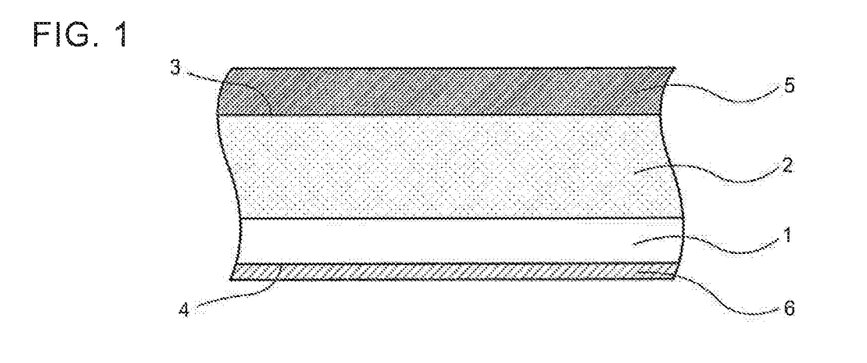
FIG. 1 shows a vertical cross section of a prior art Schottky barrier diode.

A common silicon carbon (SiC) based power semiconductor rectifier is shown in FIG. 1 in cross section. It comprises a SiC wafer including a substrate layer 1, which is made of highly doped n-type SiC, and a drift layer 2, which is made of low-doped n-type SiC formed on the substrate layer 1. The SiC wafer has a first main side 3 and a second main side 4 parallel to the first main side 3. The first main side 3 of SiC wafer, which is the anode side of the device, is covered with a first metal contact layer 5 that forms a Schottky contact with the drift layer 2. On the second main side 4, which is the cathode side of the device, there is formed a second metal contact layer 6. Typically the drift layer 2 is grown epitaxially on a highly doped n-type SiC substrate wafer used as the substrate layer 1.

Depending on the electrical polarity of the voltage between anode and cathode, the Schottky contact either blocks current flow or allows the passage of majority carriers (which are electrons in n-doped semiconductor material). These two modes correspond with the blocking and on-state operation of the power semiconductor rectifier.

Figure 2A:
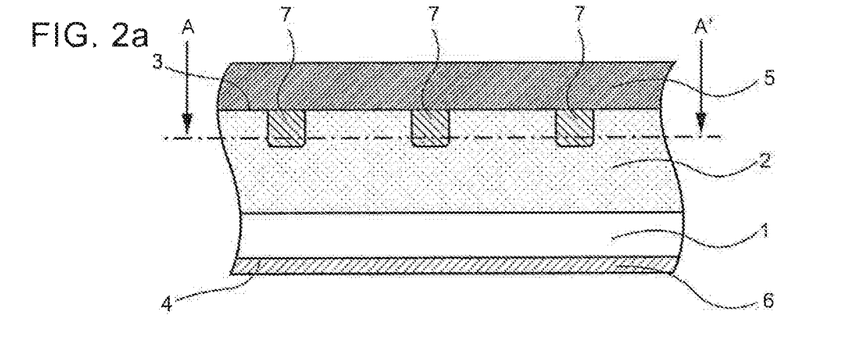
FIG. 2a shows a vertical cross section of a prior art junction barrier Schottky (JBS) diode.
Figure 2B:
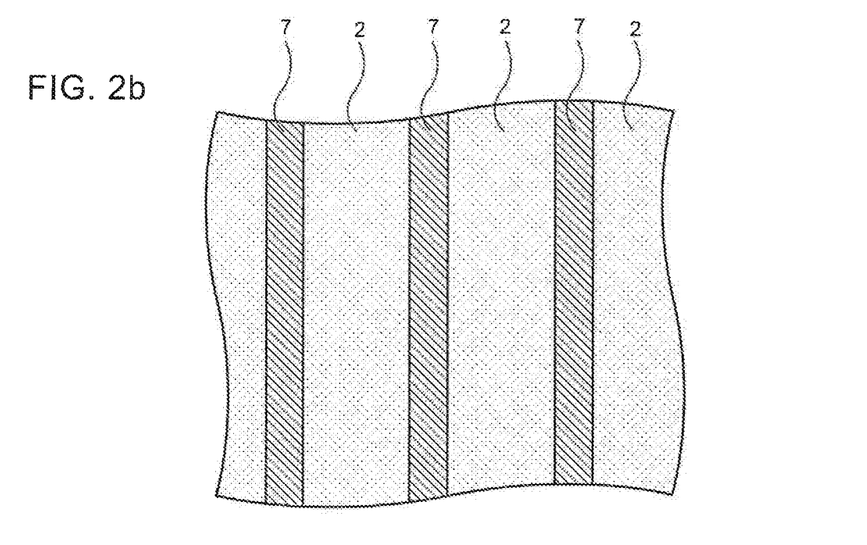

In FIGS. 2a and 2b there is shown a SiC based junction barrier Schottky (JBS) rectifier which is another common SiC based power semiconductor rectifier. A JBS rectifier is a hybrid power device, which combines a Schottky and a pin diode structure in one device, making use of the advantages of both structures. It has a low on-state resistance and a high blocking capability. Silicon carbide (SiC) based JBS rectifiers are candidates to replace silicon (Si) based pin diodes for high blocking voltages. SiC material properties allow devices with higher voltage rating and higher operating temperatures compared to Si.

FIG. 2a shows a vertical cross-section vertical to a first main side 3 of the device, whereas FIG. 2b shows a horizontal cross section along line AA' in FIG. 2a and parallel to the first main side 3. Like the power semiconductor rectifier shown in FIG. 1, the JBS rectifier shown in FIGS. 2a and 2b comprises a SiC wafer including a substrate layer 1, which is made of highly doped n-type SiC, and a drift layer 2, which is made of low-doped n-type SiC formed on the substrate layer 1. The SiC wafer has a first main side 3, which is the first main side of the device, and a second main side 4 parallel to the first main side 3. Adjacent to the surface of the drift layer 2, on the first main side 3 opposite to the substrate layer 1, there are formed a plurality of p-type emitter regions 7. The first main side 3 of the SiC wafer, which is the anode side of the device, is covered with the first metal contact layer 5 that forms a Schottky contact in places where the first metal contact layer 5 contacts the n-type drift layer 2 and that forms an ohmic contact with the p-type emitter regions 7 in places where the first metal contact layer 5 contacts the p-type emitter regions 7. Throughout this specifications the term ohmic contact refers to a non-rectifying junction between two materials, which has linear current-voltage characteristics. In contrast thereto the term Schottky contact refers throughout this specifications to a rectifying junction between a semiconductor and a metal, which has non-linear current-voltage characteristics.

The blocking capability of the above known power semiconductor rectifiers is mainly given by the thickness and doping density of the n-doped drift layer 2. However, as a result of the nature of the Schottky contact, image force lowering at elevated electric field levels at high blocking voltages causes the barrier for electrons to shrink. The power semiconductor rectifier shown in FIG. 1, which is a pure Schottky barrier diode without p-doped emitter regions 7, will be prone to increasing levels of leakage currents at high reverse bias. The comparatively large number of carriers will entail intensified electron-hole pair generation during impact ionization. As a result, the power semiconductor rectifier shown in FIG. 1 exhibits a relatively high leakage current and a low breakdown voltage. In a the JBS rectifier shown in FIGS. 2a and 2b, the p-type emitter regions 7 help to improve this situation. Under reverse bias, a depletion layer develops across the pn-junctions between the p-type emitter regions 7 and the n-type drift layer 2 in the same way as it does in a pin diode, The individual depletion zones around the p-doped emitter regions 7 may eventually connect with each other and close in between two adjacent emitter regions 7 below the Schottky contact. In this way the Schottky contact is effectively protected from a high electric field peak. The combination of Schottky contacts with p-doped emitter regions 7 will therefore reduce leakage currents and allow to reach much higher breakdown voltages compared to pure Schottky barrier diodes such as the power semiconductor rectifier shown in FIG. 1.

In the above described power semiconductor rectifiers, the energy difference between the work function of the metal used for the first metal contact layer 5 and the conduction band edge of the drift layer 2 defines the Schottky barrier height, which defines the on-state voltage. This, in turn, is in principle bound by the choice of the metal. Consequently, the on-state voltage of the known power semiconductor rectifiers is limited by the type of metal, which has to fulfill process compatibility requirements. Therefore, the number of metals to be used for the first metal contact layer 5 in the above known power semiconductor rectifiers is very limited.

The on-state voltage should be as low as possible to minimize losses under forward bias conditions. A known approach to lower the onstate voltage while maintaining the blocking capability is the use of two different metals for the first metal contact layer resulting in a dual Schottky barrier height (SBH) rectifier. Such dual SBH rectifier is described in U.S. Pat. No. 6,362,495,B1, for example. However, using two different metals for the first metal contact layer requires additional process steps during manufacturing of the device, which involves higher costs.

SUMMARY OF THE INVENTION

In view of the above described disadvantages of the prior art it is the object of the invention to provide a power semiconductor rectifier with low on-state voltage and high blocking capability and to provide an easy, reliable and efficient manufacturing method for manufacturing such power semiconductor rectifier.

The object is attained by a power semiconductor rectifier according to claim 1.

In the power semiconductor rectifier of the invention the thin barrier modulation layer having a higher doping concentration than the remaining drift layer (i.e. the base layer)

lowers the Schottky barrier height of the contact between the drift layer and the electrode layer to decrease the on-state voltage of the device without impairing the blocking capability. The lower Schottky barrier height increases carrier injection through band bending and tunnelling. By using a barrier modulation layer which has a thickness below 0.2 μm and which has a doping level low enough to form a Schottky contact with the electrode layer, it is possible to avoid any significant impairment of the blocking capability.

In an exemplary embodiment of the power semiconductor rectifier of the invention the base layer has a peak net doping concentration in a range between $8 \cdot 10^{14}$ cm$^{-3}$ and $6 \cdot 10^{15}$ cm$^{-3}$. Throughout this specification a peak net doping concentration of a layer means the maximum net doping concentration of this layer. With such doping concentration a good compromise between low on-state voltage and high blocking capability can be achieved.

In an exemplary embodiment of the power semiconductor rectifier of the invention the het doping concentration of the barrier modulation layer is in a range between $5 \cdot 10^{16}$ cm$^{-3}$ and $1 \cdot 10^{19}$ cm$^{-3}$, i.e. the minimum net doping concentration in the barrier modulation layer is above $5 \cdot 10^{16}$ cm$^{-3}$ whereas the maximum net doping concentration in the barrier modulation layer is below $1 \cdot 10^{19}$ cm$^{-3}$. Such a value for the net doping concentration can ensure a significant lowering of the Schottky barrier height compared to the Schottky barrier height when the Schottky contact is directly formed with the base layer having a peak net doping concentration below $1 \cdot 10^{16}$ cm$^{-3}$.

in an exemplary embodiment of the power semiconductor rectifier of the invention the net doping concentration of the barrier modulation layer is in a range between $1 \cdot 10^{17}$ cm$^{-3}$ and $5 \cdot 10^{18}$ cm$^{-3}$. In such exemplary embodiment an improved compromise between low on-state voltage and high blocking capability can be achieved.

In an exemplary embodiment of the power semiconductor rectifier of the invention the electrode layer penetrates through the barrier modulation layer to be in direct contact with the base layer, wherein the contact between the electrode layer and the base layer is a first-barrier Schottky contact and the contact between the electrode layer and the barrier modulation layer is a second-barrier Schottky contact, the Schottky barrier height of the first-barrier Schottky contact being higher than that of the second-barrier Schottky contact, In this exemplary embodiment a dual barrier height rectifier can be realized with the use of only one single electrode layer material which is the same for the first-barrier Schottky contact and for the second-barrier Schottky contact.

In an exemplary embodiment of the power semiconductor rectifier of the invention the drift layer has a first main side and a second main side parallel to the first main side, wherein the first-barrier Schottky contact includes a plurality of first-barrier Schottky contact sections, wherein the second-barrier Schottky contact includes a plurality of second-barrier Schottky contact sections, and wherein the first-barrier Schottky contact sections alternate with the second-barrier Schottky contact sections in at least one lateral direction parallel to the first main side. Therein, the first-barrier Schottky contact sections may form a grid or a honeycomb structure. In this exemplary embodiment the blocking capability can be further improved.

In an exemplary embodiment the power semiconductor rectifier of the invention comprises a plurality of emitter regions, wherein each emitter region has a second conductivity type different from the first conductivity type, wherein the electrode layer forms an ohmic contact with each one of the emitter regions, and wherein each emitter region forms a pn-junction with the base layer. In this exemplary embodiment the power semiconductor rectifier is a JBS rectifier which exhibits an improved blocking capability.

In the power semiconductor rectifier of the invention the drift layer may be made of silicon carbide or silicon. Silicon carbide has material properties which are exemplarily for power semiconductor devices.

The object of the invention is also attained by a method for manufacturing such a power semiconductor rectifier according to claim 10.

In an exemplary embodiment of the method the method comprises, before the step of forming the electrode layer, a step of forming at least one trench or hole into the drift layer, the trench or hole penetrating through the barrier modulation layer and extending into the base layer. The electrode layer may be formed in the at least one trench or hole to form a Schottky contact with the base layer. Such exemplary embodiment allows to manufacture a dual SBH rectifier with only one single electrode layer in a simple and efficient manner.

In an exemplary embodiment the method comprises a step of forming an emitter region at least at the bottom portion of the at least one trench or hole before the step of forming the electrode layer, wherein the emitter region has a second conductivity type different from the first conductivity type and forms a pn-junction with the drift layer, and wherein the electrode layer forms an ohmic contact with the emitter region. Therein, the emitter region may be formed by depositing a semiconductor layer of the second conductivity type into the at least one trench or hole or the emitter region may be formed by implanting a dopant of the second conductivity type into the drift layer at least at the bottom portion of the at least one trench or hole. In such exemplary embodiment a JBS rectifier can be manufactured in a simple and efficient manner with a low on-state voltage and a relatively high blocking capability.

BRIEF DESCRIPTION OF THE DRAWINGS

Detailed embodiments of the invention will be explained below with reference to the accompanying figures, in which:

FIG. 2b shows a horizontal cross section of the prior art junction barrier Schottky (JBS) diode of FIG. 2a, wherein the cross section is taken along line AA' in FIG. 2a;

4a shows a vertical cross section of a power semiconductor rectifier according to a second embodiment;

FIG. 4b shows a horizontal cross section of the power semiconductor rectifier according to the second embodiment, wherein the cross section is taken along a line AA' in FIG. 4a;

FIG. 5b shows a horizontal cross section of the power semiconductor rectifier according to the third embodiment, wherein the cross section is taken along a line AA' in FIG. 5a;

FIG. 6b shows a horizontal cross section of the power semiconductor rectifier according to the fourth embodiment, wherein the cross section is taken along a line AA' in FIG. 6a;

FIG. 7b shows a horizontal cross section of the power semiconductor rectifier according to the fifth embodiment, wherein the cross section is taken along a line AA' in FIG. 7a.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF EXEMPLARY EMBODIMENTS

Figure 3:
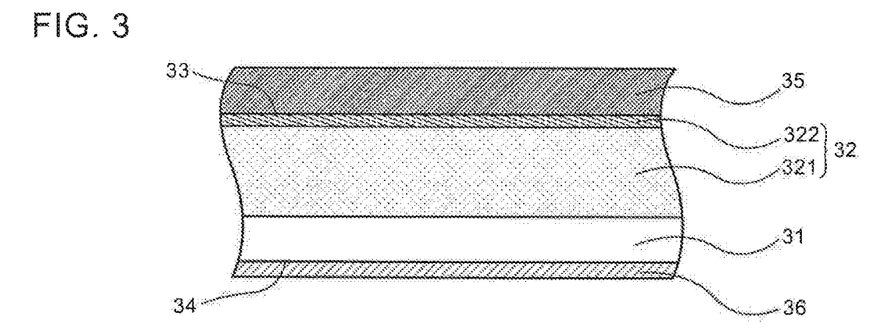
FIG. 3 shows a vertical cross section of a power semiconductor rectifier according to a first embodiment.

In FIG. 3 there is shown a vertical cross section of a power semiconductor rectifier according to a first embodiment. The power semiconductor rectifier according to the first embodiment is a 4H-SiC based power semiconductor rectifier. It comprises a 4H-SiC wafer having a first main side 33 and a second main side 34 parallel to the first main side 33. From the first main side 33 to the second main side 34 the 4H-SiC wafer includes a barrier modulation layer 322, a base layer 321, and a substrate layer 31. The substrate layer 31 is made of highly doped n-type 4H-SiC having a net doping concentration which is higher than the peak net doping concentration (i.e. the maximum net doping concentration) of the base layer 321, which is made of low-doped n-type 4H-SiC having a peak net doping concentration below $1 \cdot 10^{16}$ cm$^{-3}$, exemplarily having a peak net doping concentration in a range between $8 \cdot 10^{14}$ cm$^{-3}$ and $6 \cdot 10^{15}$ cm$^{-3}$. The net doping concentration of the substrate layer 31 adjacent to the second main side 34 is exemplarily $1 \cdot 10^{19}$ cm$^{-3}$ or more. The barrier modulation layer 322 is made of n-type 4H-SiC having a net doping concentration in a range between $1 \cdot 10^{16}$ cm$^{-3}$ and $1 \cdot 10^{19}$ cm$^{-3}$, exemplarily in a range between $5 \cdot 10^{16}$ cm$^{-3}$ and $1 \cdot 10^{19}$ cm$^{-3}$, and further exemplarily in a range between $1 \cdot 10^{17}$ cm$^{-3}$ and $5 \cdot 10^{18}$ cm$^{-3}$. The base layer 321 and the barrier modulation layer 322 form a drift layer 32 in the power semiconductor rectifier according to the first embodiment.

On the first main side 33 of the 4H-SiC wafer there is formed a first electrode layer 35 which is in direct contact with the barrier modulation layer 322 to form a Schottky contact between the first electrode layer 35 and the barrier modulation layer 322. The first electrode layer 35 is a metal layer, such as titanium (Ti), cobalt (Co), tantalum (Ta), tungsten (W), platinum (Pt), nickel (Ni), molybdenum (Mo), palladium (Pd), or any combination of these metals. The first electrode layer 35 can also include silicide or carbide compounds, such as NiSi, TiC, or TaC. The first electrode layer 35 can also be a stack of metal layers, e.g. Al/Ti, Al/Ni, Al/W, Al/Pt, Al/Ni/Ti, Al/Mo, Al/Pd, Al/WC, or Al/TaC, in which a diffusion barrier layer like TaSiN can be formed in between the top Al and the first metal layer.

On the second main side 34 of the 4H-SiC wafer there is formed a second electrode layer 36 which forms an ohmic contact with the substrate layer 31.

The thickness of the barrier modulation layer 322 is at least 1 nm and less than 0.2 μm in a direction perpendicular to the first main side 33, which is a direction vertical to the interface between the first electrode layer 35 and the barrier modulation layer 322. The thickness of the base layer 321 depends on the required blocking capability. Exemplarily, the thickness of the base layer in a direction vertical to the first main side 33 is in a range between 5 μm and 600 μm.

In an exemplary embodiment of a method for manufacturing the power semiconductor rectifier according to the first embodiment first a low doped n-type 4H-SiC wafer having a first main side 33 and a second main side 34 is provided. The low doped n-type 4H-SiC wafer has a net doping concentration which is identical to that of the base layer 321 in the final device. A n-type dopant is implanted and/or diffused into the 4H-SiC wafer from its second main side 34 to form the substrate layer 31 having a net doping concentration and thickness as described above. In a next step the barrier modulation layer 322 is formed adjacent to the first main side 33 by implanting and/or diffusing an n-type dopant into the 4H-SiC wafer from its first main side 33. The barrier modulation layer 322 formed in such way has a net doping concentration and a thickness as described above for the power semiconductor rectifier according to the first embodiment. Thus, a drift layer 32 is formed by forming a stack of a base layer 321 and of a barrier modulation layer 322, wherein the base layer 321 has a first conductivity type and has a peak net doping concentration below $1 \cdot 10^{16}$ cm$^{-3}$, and wherein the barrier modulation layer has the first conductivity type, has a net doping concentration in a range between $1 \cdot 10^{16}$ cm$^{-3}$ and $1 \cdot 10^{19}$ cm$^{-3}$ and has layer thickness of at least 1 nm and less than 0.2 μm.

Alternatively, the drift layer 32 including the base layer 321 and the barrier modulation layer 322 may he grown epitaxially on a highly doped n-type 4H-SiC substrate wafer used as the substrate layer 1.

Figure 8A:
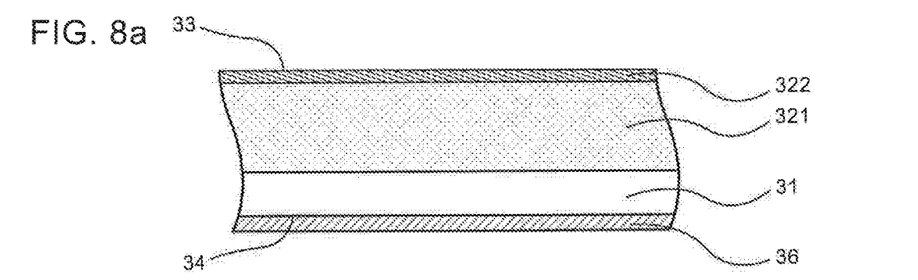
FIGS. 8a to 8d illustrate different steps in manufacturing methods for manufacturing the power semiconductor rectifiers according to the first to fifth embodiment.

Thereafter, the second electrode layer 36 is deposited on the second main side 34 to form an ohmic contact between the second electrode layer 36 and the substrate layer 31. The device after the deposition of the second electrode layer 36 is shown in FIG. 8a in a vertical cross section perpendicular to the first main side 33 of the 4H-SiC wafer.

As a final process step to obtain the power semiconductor rectifier according to the first embodiment, a step of forming the first electrode layer 35 on the barrier modulation layer 322 is performed to form a Schottky contact between the first electrode layer 35 and the barrier modulation layer 322.

Figure 4A:
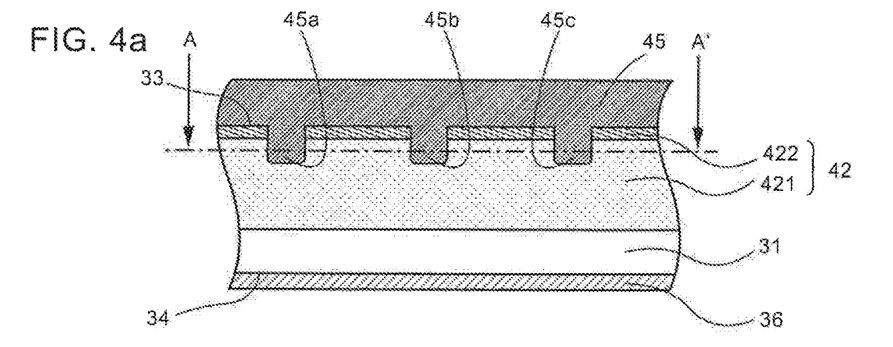
Figure 4B:
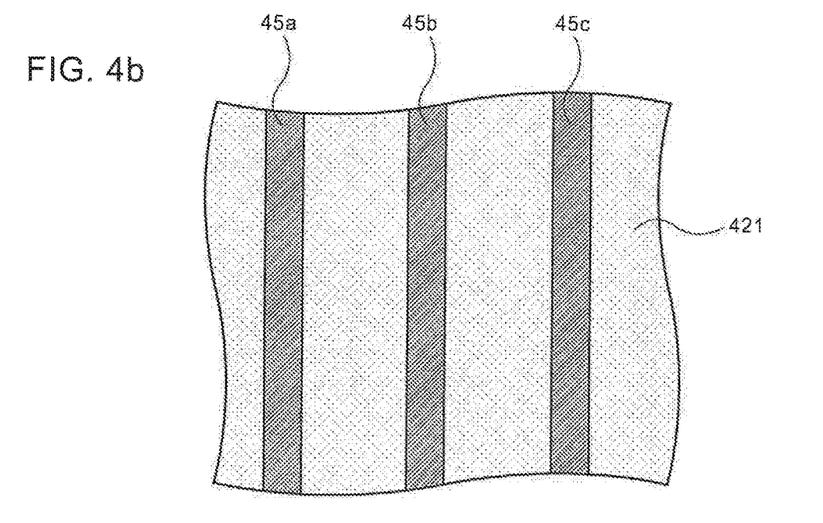

Next there is described a power semiconductor rectifier according to a second embodiment. FIG. 4a shows a vertical cross section and FIG. 4b shows a horizontal cross section of the power semiconductor rectifier according to the second embodiment, wherein the horizontal cross section is taken along a line AA' in FIG. 4a. The power semiconductor rectifier according to the second embodiment is a dual Schottky barrier height (SBH) rectifier. Due to the many similarities with the power semiconductor rectifier according to the first embodiment, mainly differences of the second embodiment to the first embodiment will be described. When same reference signs are used for elements in different embodiments, this means throughout the description that these elements may have the same or similar physical properties.

Like the power semiconductor rectifier according to the first embodiment, the power semiconductor rectifier according to the second embodiment is a 4H-SiC based power semiconductor rectifier. It comprises a 4H-SiC wafer having a first main side 33 and a second main side 34 parallel to the first main side 33. From the first main side 33 is to the second main side 34 the 4H-Sic wafer includes a barrier modulation layer 422, a base layer 421, and a substrate layer 31 which is identical to the substrate layer 31 in the first embodiment. The barrier modulation layer 422 is similar to the barrier modulation layer 322 in the first embodiment. It is made of n-type 4H-SiC having a net doping concentration in a range between $1 \cdot 10^{16}$ cm$^{-3}$ and $1 \cdot 10^{19}$ cm$^{-3}$, exemplarily in a range between $5 \cdot 10^{16}$ cm$^{-3}$ and $1 \cdot 10^{19}$ cm$^{-3}$, and further exemplarily in a range between $1 \cdot 10^{17}$ cm$^{-3}$ and $5 \cdot 10^{18}$ cm$^{-3}$. Similar to the first embodiment, the base layer 421 and the barrier modulation layer 422 form a drift layer 42 in the power semiconductor rectifier according to the second embodiment.

The thickness of the barrier modulation layer 422 and the thickness of the base layer 421 in a direction vertical to the first main side 33 are the same as that of the barrier modulation layer 322 and the base layer 321 in the first embodiment.

On the first main side 33 of the 4H-SiC wafer there is formed a first electrode layer 45 which is in direct contact with the barrier modulation layer 422 to form a plurality of first-barrier Schottky contact sections between the first electrode layer 45 and the barrier modulation layer 422. As in the first embodiment, the first electrode layer 45 is a metal layer, such as titanium (Ti), cobalt (Co), tantalum (Ta), tungsten (W), platinum (Pt), nickel (Ni), molybdenum (Mo), palladium (Pd), or any combination of these metals. The first electrode layer 45 can also include silicide or carbide compounds, such as NiSi, TiC, or TaC. The first electrode layer 45 can also be a stack of metal layers, e.g. Al/Ti, Al/Ni, Al/W, Al/Pt, Al/Ni/Ti, Al/Mo, Al/Pd, Al/WC, or Al/TaC, in which a diffusion barrier layer like TaSiN can he formed in between the top Al and the first metal layer.

In the second embodiment the first electrode layer 45 penetrates through the barrier modulation layer 422 and extends into the base layer 421 to form strip-shaped electrode sections 45a, 45b, 45c extending parallel to each other inside of the 4H-SiC wafer, i.e. between the first main side 33 and the second main site 34. The strip-shaped electrode sections 45a, 45b and 45c are in direct contact with the base layer 421 to form a plurality of second-barrier Schottky contact sections with the base layer 421. The first-barrier Schottky contact sections have all a same first barrier height and the second-barrier Schottky contact sections have all a same second barrier height. Due to the different doping concentration in the base layer 421 and the barrier modulation layer 422, the first barrier height is lower than the second barrier height.

In a lateral direction parallel to the first main side 33 and perpendicular to the longitudinal axis of the strip-shaped electrode sections 45a, 34b and 45c, the first-barrier Schottky contact sections alternate with the second-barrier Schottky contact sections in such way that between each pair of two neighboring second-barrier Schottky contact sections a first-harrier Schottky contact section is formed, and that between each pair of two neighboring first-harrier Schottky contact sections a second-harrier Schottky contact section is formed.

On the second main side 34 of the 4H-SiC wafer there is formed a second electrode layer 36 which forms an ohmic contact with the substrate layer 31 as in the first embodiment.

Figure 8B:
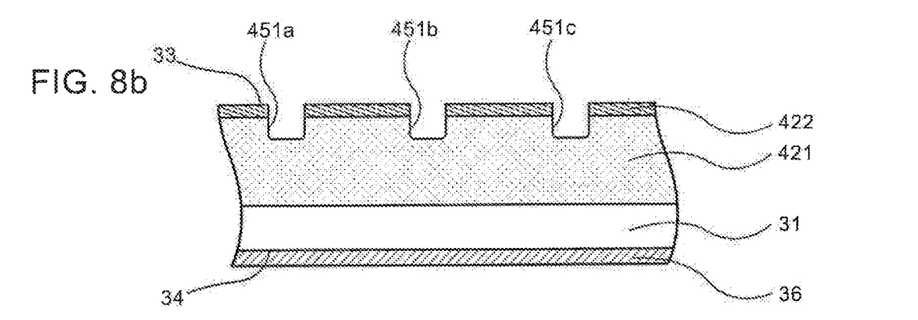

Next a method for manufacturing, the power semiconductor rectifier according to the second embodiment will be described with FIGS. 8a, and 8b. First a structure as shown in FIG. 8a is manufactured in the same way as in the manufacturing method for the power semiconductor rectifier according to the first embodiment described above. In a next step strip-shaped trenches 451a, 451b and 451c are formed in the 4H-SiC wafer from its first main side 33 by a dry or wet etching process. The trenches 451a, 451b and 451c penetrate through the barrier modulation layer 322 to form a penetrated barrier modulation layer 422 and to extend into the base layer 421 as shown in FIG. 8b. The depth of the trenches 451a, 451b and 451c from the first main side 33 is exemplarily in a range between 0.1 μm and 10 μm, more exemplarily in a range between 0.2 μm and 5 μm, but less than the thickness of the drift layer 42. Exemplarily, the trenches 451a, 451b and 451c have all the same depth. In a next step the first electrode layer 45 as described above is formed on the first main side 33 of the structure shown in FIG. 8b to obtain the power semiconductor rectifier according to the second embodiment as shown in FIG. 4a.

Figure 5A:
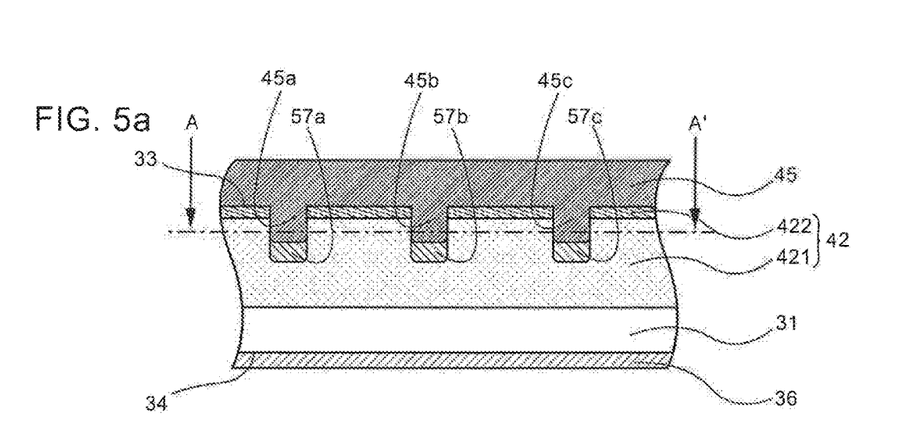
FIG. 5a shows a vertical cross section of a power semiconductor rectifier according to a third embodiment.
Figure 5B:
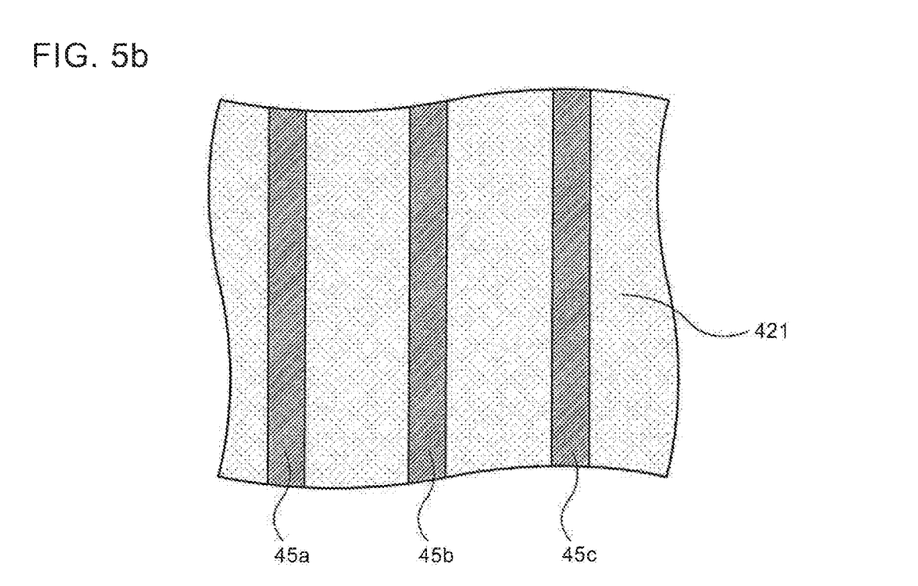

FIGS. 5a and 5b illustrate a power semiconductor rectifier according to a third embodiment. Therein, FIG. 5a shows a vertical cross section and FIG. 5b shows a horizontal cross section of the power semiconductor rectifier according to the third embodiment, wherein the horizontal cross section is taken along a line AA' in FIG. 5a.

The power semiconductor rectifier according to the third embodiment is a trench junction barrier Schottky (JBS) rectifier, Due to the many similarities with the power semiconductor rectifier according to the second embodiment, mainly differences of the third embodiment to the second embodiment will be described.

As the power semiconductor rectifier according to the second embodiment, the power semiconductor rectifier according to the third embodiment is a 4H-SiC based power semiconductor rectifier. It comprises a 4H-SiC wafer having a first main side 33 and a second main side 34 parallel to the first main side 33. From the first main side 33 to the second main side 34 the 4H-SiC wafer includes a barrier modulation layer 422 which is the same as the barrier modulation layer 422 in the second embodiment, a base layer 421 which is the same as the base layer 421 in the second embodiment, and a substrate layer 31 which is the same as the substrate layer 31 in the first and second embodiment, respectively.

On the first main side 33 of the 4H-SiC wafer there is formed a first electrode layer 45 which is in direct contact with the barrier modulation layer 422 to form a plurality of first-barrier Schottky contact sections between the first electrode layer 45 and the barrier modulation layer 422 as in the second embodiment. The first electrode 45 in the third embodiment is the same as the first electrode 45 in the second embodiment.

As in the second embodiment also in the third embodiment, the first electrode layer 45 penetrates through the barrier modulation layer 422 and extends into the base layer 421 to form strip-shaped electrode sections 45a, 45b, 45c extending parallel to each other inside of the 4H-SiC wafer, i.e. between the first main side 33 and the second main side 34. The sidewalls of the strip-shaped electrode sections 45a, 45b and 45c are in direct contact with the base layer 421 to form a plurality of second-barrier Schottky contact sections with the base layer 421. The first-barrier Schottky contact sections have to all a same first barrier height and the second-barrier Schottky contact sections have all a same second barrier height, Due to the different doping concentration in the base layer 421 and the barrier modulation layer 422, the first barrier height is lower than the second barrier height as in the second embodiment.

The power semiconductor rectifier according to the third embodiment differs from the power semiconductor rectifier according to the second embodiment in that there are p-type emitter regions 57a, 57b and 57c buried inside of the base layer 421 to form a plurality of pn-junctions between the p-type emitter regions 57a, 57b and 57c and the n-type base layer 421, respectively. The emitter regions 57a, 57b and 57c are in direct contact with the electrode sections 45a, 45b and 45c, respectively, to form an ohmic contact between the first electrode layer 45 and the emitter regions 57a, 57b and 57c, respectively. The emitter regions 57a, 57b and 57c are strip-shaped regions, which extend parallel to the strip-shaped electrode sections 45a, 45b and 45c.

In a projection perpendicular to the first main side 33, the first-barrier Schottky contact sections alternate with the pn-junctions along a lateral direction parallel to the first main side 33 and perpendicular to the longitudinal axis of the strip-shaped electrode sections 45a, 34b and 45c, such that between each pair of two neighboring pn-junctions there is located a first-barrier Schottky contact section.

On the second main side 34 of the 4H-SiC wafer there is formed a second electrode layer 36 which forms an ohmic contact with the substrate layer 31 as in the first and second embodiment.

Figure 8C:
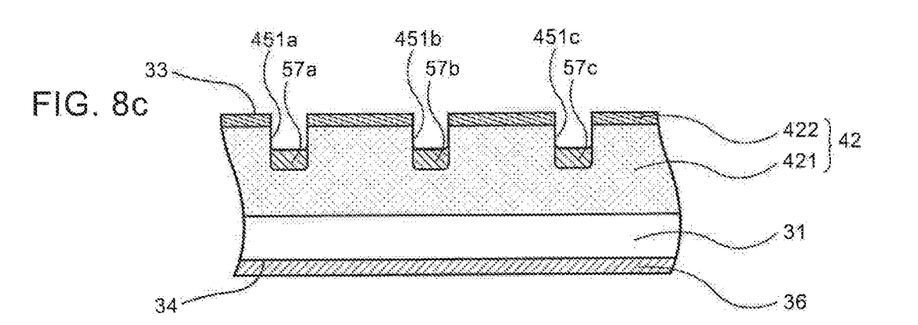

Next a method for manufacturing the power semiconductor rectifier according to the third embodiment will be described with reference to FIGS. 8b and 8c. First a structure as shown in FIG. 8b is manufactured in the same way as in the manufacturing method for the power semiconductor rectifier according to the second embodiment described above. As a next step, a p-type dopant is implanted into the bottom portion of the trenches 451a, 451b and 451c, respectively, to form the p-type emitter regions 57a, 57b and 57c at the bottom portion of the trenches 451a, 451b and 451c, respectively. Alternatively, the emitter regions 57a, 57b and 57c can also be formed at the bottom portions of the trenches 451a, 451b and 451c by depositing p-type 4H-SiC into the trenches 451a, 451b and 451c, respectively. As a next step the electrode layer is deposited onto the structure shown in FIG. 8c from the first main side 33 to obtain the power semiconductor rectifier according to the third embodiment as shown in FIG. 5a.

Figure 6A:
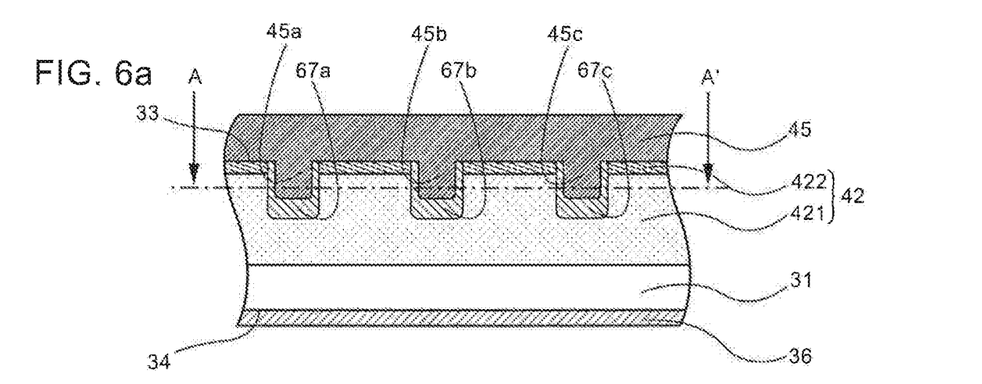
FIG. 6a shows a vertical cross section of a power semiconductor rectifier according to a fourth embodiment.
Figure 6B:
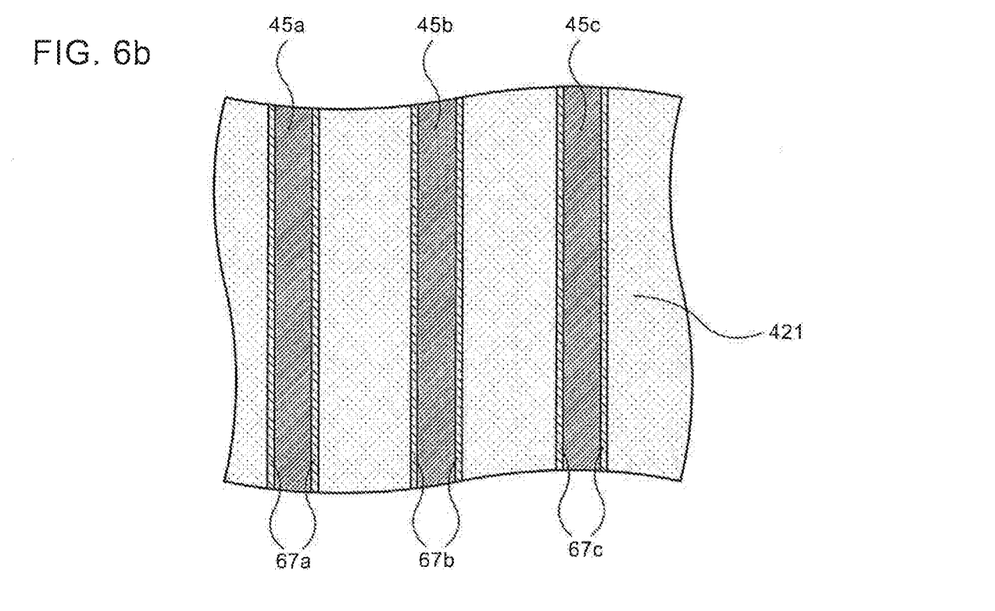

FIGS. 6a and 6b illustrate a power semiconductor rectifier according to a fourth embodiment. Therein, FIG. 6a shows a vertical cross section and FIG. 6b shows a horizontal cross section of the power semiconductor rectifier according to the fourth embodiment, wherein the horizontal cross section is taken along a line AA' in FIG. 6a.

The power semiconductor rectifier according to the fourth embodiment is a trench junction barrier Schottky (JBS) rectifier. Due to the many similarities with the power semiconductor rectifier according to the third embodiment, mainly differences to the third embodiment will be described.

As the power semiconductor rectifier according to the third embodiment, the power semiconductor rectifier according to the third embodiment is a 4H-SiC based power semiconductor rectifier. It comprises a 4H-SiC wafer having a first main side 33 and a second main side 34 parallel to the first main side 33. From the first main side 33 to the second main side 34 the 4H-SiC wafer includes a barrier modulation layer 422 which is the same as the barrier modulation layer 422 in the second or third embodiment, a base layer 421 which is the same as the base layer 421 in the second or third embodiment, and a substrate layer 31 which is the same as the substrate layer 31 in the first to third embodiment, respectively.

On the first main side 33 of the 4H-SiC wafer there is formed a first electrode layer 45 which is in direct contact with the barrier modulation layer 422 to form a plurality of Schottky contact sections between the first electrode layer 45 and the barrier modulation layer 422 as in the second or third embodiment. The first electrode 45 in the third embodiment is the same as the first electrode 45 in the second or third embodiment.

As in the second or third embodiment also in the fourth embodiment, the first electrode layer 45 penetrates through the barrier modulation layer 422 and extends into the base layer 421 to form strip-shaped electrode sections 45a, 45b, 45c extending parallel to each other inside of the 4H-SiC wafer, i.e. between the first main side 33 and the second main side 34.

As the power semiconductor rectifier according to the third embodiment, the power semiconductor rectifier according to the fourth embodiment has p-type emitter regions 67a, 67b and 67c formed inside of the drift layer 42, i.e. between the first main side 33 and the second main side 34 to form a plurality of pn-junctions between the p-type emitter regions 67a, 67b and 67c and the n-type base layer 421, respectively. Each emitter region 67a, 67b or 67c is in direct contact with a respective electrode section 45a, 45b or 45c to form an ohmic contact between the first electrode layer 45 and the respective emitter region 67a, 67b or 67c. The power semiconductor rectifier according to the fourth embodiment differs from the power semiconductor rectifier according to the third embodiment in that the p-type emitter regions 67a, 67b and 67c are located adjacent to the first main side 33 and separate the electrode sections 45a, 45b, and 45c from the drift layer 42. Therefore, in contrast to the second and third embodiments, the sidewalls of the strip-shaped electrode sections 45a, 45b and 45c are not in direct contact with the base layer 421 but are separated from the drift layer 42 by the p-type emitter regions 67a, 67b and 67c, respectively.

The emitter regions 67a, 67b and 67c are parallel strip-shaped regions, which extend parallel to the strip-shaped electrode sections 45a, 45b and 45c. In a plane perpendicular to the longitudinal main axis of the strip-shaped electrode sections 45a, 45b and 45c, the emitter regions 67a, 67b and 67c have a U-shaped cross section as shown in FIG. 6a.

In a projection perpendicular to the first main side 33, the Schottky contact sections between the first electrode layer 45 and the barrier modulation layer 422 alternate with the pn-junctions between the emitter regions 67a, 67b and 67c along a lateral direction parallel to the first main side 33 and perpendicular to the longitudinal axis of the strip-shaped electrode sections 45a, 34b and 45c, such that between each pair of two neighboring pit junctions there is located a Schottky contact section.

Figure 8D:
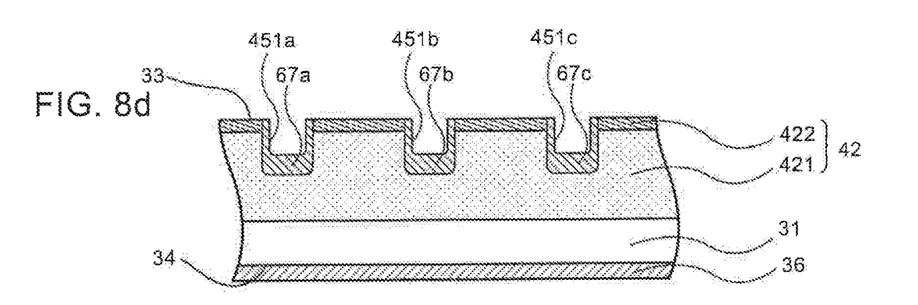

Next there is described a method for manufacturing the power semiconductor rectifier according to the fourth embodiment. In this method there is first formed a structure as shown in FIG. 8b with the process steps as described in the method for manufacturing the second or third embodiment. As a next step the emitter regions 67a, 67b and 67c are formed adjacent to the bottom portions and the sidewalk of the to trenches 451a, 451b and 451c, respectively, to obtain a structure as shown in FIG. 8d. The emitter regions 67a, 67b and 67c are formed by implantation or diffusion of a p-type dopant into the bottom portion and into the sidewalls of the trenches 451a, 451b and 451c, respectively, to obtain the structure as shown in FIG. 8d. Alternatively, the emitter regions may be formed by deposition of p-type 4H-SiC material into the trenches 451a, 451b and 451c, respectively, to cover the sidewalls and the bottom portion of the trenches 451a, 451b and 451c, respectively, with the p-type 4H-SiC material. In the latter alternative method, the trenches 451a, 451b and 451c must be wider and deeper to obtain the same dimensions of the electrode sections 45a, 45b, 45c as in the case where the emitter regions are formed by implantation or diffusion of a p-type dopant. In a next step, the first electrode layer 45 is formed onto the structure shown in FIG. 8d to obtain the power semiconductor rectifier according to the fourth embodiment as shown in FIG. 6a.

Figure 7A:
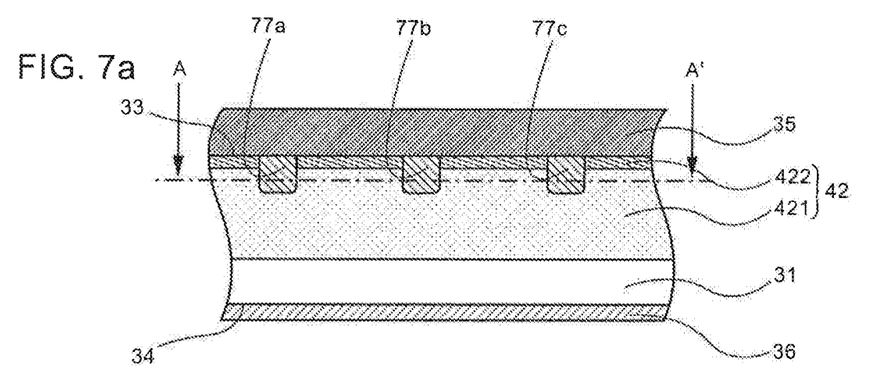
FIG. 7a shows a vertical cross section of a power semiconductor rectifier according to a fifth embodiment.
Figure 7B:
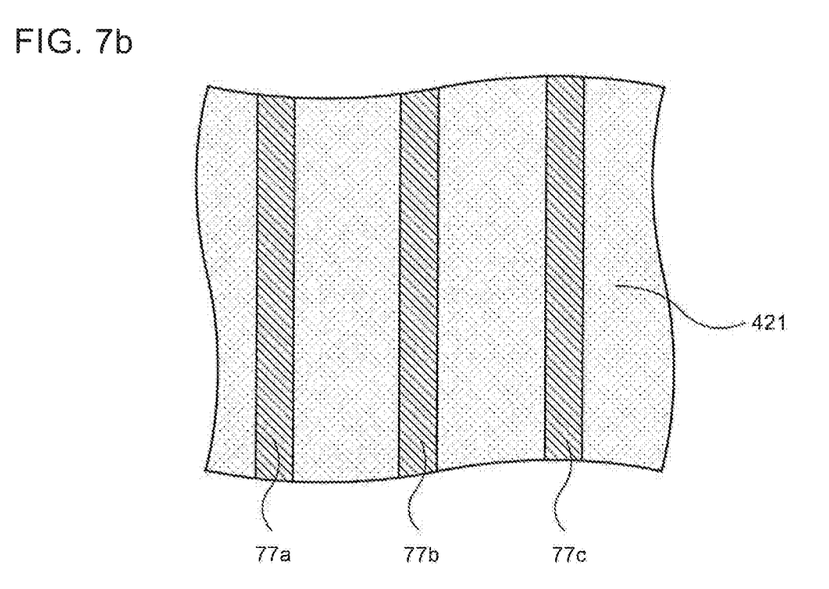

FIGS. 7a and 7b illustrate a power semiconductor rectifier according to a fifth embodiment. Therein, FIG. 7a shows a vertical cross section and FIG. 7b shows a horizontal cross section of the power semiconductor rectifier according to the fifth embodiment, wherein the horizontal cross section is taken along a line AA' in FIG. 7a.

The power semiconductor rectifier according to the fifth embodiment is a junction barrier Schottky (JBS) rectifier. Due to the many similarities with the power semiconductor rectifier according to the fourth embodiment, mainly differences of the fifth embodiment to the fourth embodiment will be described.

As the power semiconductor rectifier according to the fourth embodiment, the power semiconductor rectifier according to the fifth embodiment is a 4H-SiC based power semiconductor rectifier. It comprises a 4H-SiC wafer having a first main side 33 and a second main side 34 parallel to the first main side 33. From the first main side 33 to the second main side 34 the 4H-SiC wafer includes a barrier modulation layer 422 which is the same as the barrier modulation layer 422 in the second to fourth embodiment, a base layer 421 which is the same as the base layer 421 in the second to fourth embodiment, and a substrate layer 31 which is the same as the substrate layer 31 in the first to fourth embodiment, respectively.

On the first main side 33 of the 4H-SiC wafer there is formed a first electrode layer 35 which is in direct contact with the barrier modulation layer 422 to form a plurality of Schottky contact sections between the first electrode layer 35 and the barrier modulation layer 422 as in the fourth embodiment. The first electrode layer 35 in the fifth embodiment is the same as the first electrode layer 35 in the first embodiment and differs from the first electrode layer 45 of the fourth embodiment in that it does not penetrate through the barrier modulation layer 422.

In the power semiconductor rectifier according to the fifth embodiment there are formed p-type emitter regions 77a, 77b and 77c inside the drift layer 42 to form a plurality of pn-junctions between the p-type emitter regions 77a, 77b and 77c and the n-type base layer 421, respectively. The emitter regions 77a, 77b and 77c are in direct contact with the first electrode layer 45 to form an ohmic contact between the first electrode layer 45 and the emitter regions 77a, 77b and 77c, respectively. The emitter regions 77a, 77b and 77c are parallel strip-shaped regions, which have the same geometry as the strip-shaped electrode sections 45a, 45b and 45c in the second embodiment.

In a projection perpendicular to the first main side 33, the Schottky contact sections alternate with the pn-junctions along a lateral direction parallel to the first main side 33 and perpendicular to the longitudinal axis of the strip-shaped emitter regions 77a, 77b and 77c, such that between each pair of two neighboring pn-junctions there is located a Schottky contact section.

Next a method for manufacturing the power semiconductor rectifier according to the fifth embodiment is described. First a structure as shown in FIG. 8a is formed in the same manner and with the same method steps as in the method for manufacturing the power semiconductor rectifier according to the first embodiment described above. As a next step the emitter regions 77a, 77b and 77c are formed in the drift layer 32 to penetrate the barrier modulation layer 322 and extend into the base layer 321 by selective implantation and/or diffusion of a p-type dopant into the drift layer 32 from the first main side 33. Alternatively, first a structure as shown in FIG. 8b may be formed as in the method for manufacturing the power semiconductor rectifier according to the second embodiment and the trenches 451a, 451b and 451c may be filled by deposition of p-type 4H-SiC material into these trenches. Next a first electrode layer 35 is formed on the first main side to obtain the power semiconductor rectifier according to the fifth embodiment as shown in FIG. 7a.

It will be apparent for persons skilled in the art that modifications of the above described embodiment are possible without departing from the idea of the invention as defined by the appended claims.

In the above described embodiments there was used 4H-SiC as a semiconductor material for the drift layer 32, 42, the substrate layer 31 and the emitter regions 57a, 57b, 57c, 67a, 67b, 67c, 77a, 77b, 77c. However, other SiC polytypes such as 6H-SiC, 15R-SiC or 3C-SiC may be used. Also other semiconductor materials such as group III-nitride compound semiconductor materials (GaN, AlN or AlGaN, for example) or silicon (Si) may be used in the power semiconductor rectifier of the invention. It is not only possible to use one single semiconductor material but also a combination of different semiconductor materials such as a combination of silicon and germanium may be employed.

In the above described fourth embodiment, the barrier modulation layer 422 was shown in FIG. 6a in direct contact with the p-type emitter regions 67a, 67b and 67c. However, in a modified embodiment, the barrier modulation layer 422 may be spaced from the p-type emitter regions 67a, 67b and 67c, exemplarily at a distance of 50 nm to 100 nm. The barrier modulation layer 422 may be separated from the p-type emitter regions 67a, 67b and 67c by the base layer 421, which forms a Schottky contact with the first electrode layer 45 at the first main side 33 of the 4H-SiC wafer.

Likewise in the above described fifth embodiment, the barrier modulation layer 422 was shown in FIG. 7a in direct contact with the p-type emitter regions 77a, 77b and 77c. However, the barrier modulation layer 422 may he spaced from the p-type emitter regions 77a, 77b and 77c, exemplarily at a distance of 50 nm to 100 nm. The barrier modulation layer 422 may be separated from the p-type emitter regions 77a, 77b and 77c by the base layer 421, which forms a Schottky contact with the first electrode layer 35 at the first main side 33 of the 4H-SiC wafer.

In all above embodiments, the barrier modulation layer 322, 422 may have either a homogeneous doping concentration or may have a graded doping profile or any other doping profile as long as the net doping concentration is in a range between $1 \cdot 10^{16}$ cm$^{-3}$ and $1 \cdot 10^{19}$ cm$^{-3}$.

In the above described power semiconductor rectifiers according to the second to fourth embodiment of the invention, the electrode sections 45a, 45b and 45c were described to be strip-shaped and parallel to each other. However, other geometries and structures arc possible. For example the electrode sections may form a pattern of islands, a grid structure or a honeycomb structure in a projection onto a plane parallel to the first main side 33. The same applies to the emitter regions 57a, 57b, 57c, 67a, 67b, 67c, 77a, 77b, 77c in the power semiconductor rectifier according to the third to fifth embodiment. Accordingly, it may be necessary in a method for manufacturing such power semiconductor rectifier to form holes instead of trenches.

The above embodiments were explained with specific conductivity types. The conductivity types of the semiconductor layers in the above described embodiments might be switched, so that all layers which were described as p-type layers would be n-type layers and all layers which were described as n-type layers would be p-type layers. For example, in a modified third embodiment, the substrate layer 31 and the drill layer 42 including the base layer 421 and the barrier modulation layer 422 may he p-type layers, and the emitter regions 57a, 57b, 57c may be n-type layers as long as all emitter regions have another conductivity type than the substrate layer and the drift layer in the same power semiconductor rectifier.

It should be noted that the term "comprising" does not exclude other elements or steps and that the indefinite article "a" or "an" does not exclude the plural. Also elements described in association with different embodiments may be combined.

LIST OF REFERENCE SIGNS 1 substrate layer
2 drift layer
3 first main side
4 second main side
5 first metal contact layer
6 second metal contact layer
7 emitter region
31 substrate layer
32 drift layer
33 first main side
34 second main side
35 first electrode layer
36 second electrode layer
42 drift layer
45a strip-shaped electrode section
45b strip-shaped electrode section
45c strip-shaped electrode section
67a emitter region
67b emitter region
67c emitter region
57a emitter region
57b emitter region
57c emitter region
77a emitter region
77b emitter region
77c emitter region
321 base layer
322 barrier modulation layer
421 base layer
422 barrier modulation layer
451a trench
451b trench
451c trench

The invention claimed is:

1. Power semiconductor rectifier comprising:
a drift layer having a first conductivity type; and
an electrode layer forming a Schottky contact with the drift layer,
wherein the drift layer includes a base layer having a peak net doping concentration below $1 \cdot 10^{16}$ cm$^{-3}$,
wherein the drift layer includes a barrier modulation layer which is in direct contact with the electrode layer to form at least a part of the Schottky contact, wherein a net doping concentration of the barrier modulation layer is in a range between $1 \cdot 10^{16}$ cm$^{-3}$ and $1 \cdot 10^{19}$ cm$^{-3}$, the barrier modulation layer has a layer thickness in a direction vertical to the interface between the electrode layer and the barrier modulation layer of at least 1 nm and less than 0.2 μm.

2. Power semiconductor rectifier according to claim 1, wherein the base layer has a peak net doping concentration in a range between $8 \cdot 10^{14}$ cm$^{-3}$ and $6 \cdot 10^{15}$ cm$^{-3}$.

3. Power semiconductor rectifier according to claim 1, wherein the net doping concentration of the barrier modulation layer is in a range between $5 \cdot 10^{16}$ cm$^{-3}$ and $1 \cdot 10^{19}$ cm$^{-3}$.

4. Power semiconductor rectifier according to claim 3, wherein the net doping concentration of the barrier modulation layer is in a range between $1 \cdot 10^{17}$ cm$^{-3}$ and $5 \cdot 10^{18}$ cm$^{-3}$.

5. Power semiconductor rectifier according to claim 1, wherein the electrode layer penetrates through the barrier modulation layer to be in direct contact with the base layer, and
wherein the contact between the electrode layer and the base layer is a first-barrier Schottky contact and the contact between the electrode layer and the barrier modulation layer is a second-barrier Schottky contact, the Schottky barrier height of the first-barrier Schottky contact being higher than that of the second-barrier Schottky contact.

6. Power semiconductor rectifier according to claim 5, wherein the drift layer has a first main side and a second main side parallel to the first main side, wherein the first-barrier Schottky contact includes a plurality of first-barrier Schottky contact sections, wherein the second-barrier Schottky contact includes a plurality of second-barrier Schottky contact sections, and wherein the first-barrier Schottky contact sections alternate with the second-barrier Schottky contact sections in at least one lateral direction parallel to the first main side.

7. Power semiconductor rectifier according to claim 6, wherein the first-barrier Schottky contact sections form a grid or honeycomb structure.

8. Power semiconductor rectifier according to claim 1, further comprising a plurality of emitter regions, wherein:
each emitter region has a second conductivity type different from the first conductivity type,
the electrode layer forms an ohmic contact with each one of the emitter regions, and
each emitter region forms a pn-junction with the base layer.

9. Power semiconductor rectifier according to claim 1, wherein the drift layer is made of silicon carbide.

10. Method for manufacturing a power semiconductor rectifier, the method comprising:
forming a drift layer by forming a stack of a base layer and of a barrier modulation layer, wherein the base layer has a first conductivity type and has a peak net doping concentration below $1 \cdot 10^{16}$ cm$^{-3}$, and wherein the barrier modulation layer has the first conductivity type, has a net doping concentration in a range between $1 \cdot 10^{16}$ cm$^{-3}$ and $1 \cdot 10^{19}$ cm$^{-3}$ and has layer thickness of at least 1 nm and less than 0.2 μm; and
forming an electrode layer on the barrier modulation layer to form a Schottky contact with the barrier modulation layer.

11. Method for manufacturing a power semiconductor rectifier according to claim 10, the method further comprising, before the forming the electrode layer, forming at least one trench or hole into the drift layer, the trench or hole penetrating through the barrier modulation layer and extending into the base layer.

12. Method for manufacturing a power semiconductor rectifier according to claim 11, the method further comprising forming an emitter region at least at the bottom portion of the at least one trench or hole before the step of forming the electrode layer, wherein the emitter region has a second conductivity type different from the first conductivity type and forms a pn-junction with the drift layer, and wherein the electrode layer forms an ohmic contact with the emitter region.

13. Method for manufacturing a power semiconductor rectifier according to claim 12, wherein the emitter region is formed by depositing a semiconductor layer of the second conductivity type into the at least one trench or hole.

14. Method for manufacturing a power semiconductor rectifier according to claim 12, wherein the emitter region is formed by implanting a dopant of the second conductivity type into the drift layer at least at the bottom portion of the at least one trench or hole.

15. Method for manufacturing a power semiconductor rectifier according to claim 11, wherein the electrode layer is formed in the at least one trench or hole to form a Schottky contact with the base layer.

16. Power semiconductor rectifier according to claim 1, wherein the drift layer is made of silicon.

17. Power semiconductor rectifier according to claim 2, wherein the net doping concentration of the barrier modulation layer is in a range between $5 \cdot 10^{16}$ cm$^{-3}$ and $1 \cdot 10^{19}$ cm$^{-3}$.

18. Power semiconductor rectifier according to claim 2, wherein the electrode layer penetrates through the barrier modulation layer to be in direct contact with the base layer, and
   wherein the contact between the electrode layer and the base layer is a first-barrier Schottky contact and the contact between the electrode layer and the barrier modulation layer is a second-barrier Schottky contact, the Schottky barrier height of the first-barrier Schottky contact being higher than that of the second-barrier Schottky contact.

19. Power semiconductor rectifier according to claim 3, wherein the electrode layer penetrates through the barrier modulation layer to be in direct contact with the base layer, and
   wherein the contact between the electrode layer and the base layer is a first-barrier Schottky contact and the contact between the electrode layer and the barrier modulation layer is a second-barrier Schottky contact, the Schottky barrier height of the first-barrier Schottky contact being higher than that of the second-barrier Schottky contact.

20. Power semiconductor rectifier according to claim 2, further comprising a plurality of emitter regions, wherein:
   each emitter region has a second conductivity type different from the first conductivity type,
   the electrode layer forms an ohmic contact with each one of the emitter regions, and
   each emitter region forms a pn-junction with the base layer.

* * * * *